US007075385B2

(12) United States Patent
Haunberger et al.

(10) Patent No.: US 7,075,385 B2
(45) Date of Patent: Jul. 11, 2006

(54) IMPEDANCE CONVERTER DEVICE

(75) Inventors: Thomas Haunberger, Bad Reichenhall (DE); Wolfgang Heibler, Ostermünchen (DE); Stephan Dandlberger, Stephanskirchen (DE)

(73) Assignee: Kathrein-Werke KG, Rosenheim (DE)

( * ) Notice: Subject to any disclaimer, the term of this patent is extended or adjusted under 35 U.S.C. 154(b) by 31 days.

(21) Appl. No.: 10/834,381

(22) Filed: Apr. 29, 2004

(65) Prior Publication Data

US 2005/0242901 A1 Nov. 3, 2005

(51) Int. Cl.
*H03H 7/38* (2006.01)

(52) U.S. Cl. ........................ 333/35; 333/125; 333/127; 333/136

(58) Field of Classification Search .................. 333/33, 333/35, 263, 124, 125, 127, 128, 136
See application file for complete search history.

(56) References Cited

U.S. PATENT DOCUMENTS

| | | | | |
|---|---|---|---|---|
| 2,531,437 | A | | 11/1950 | Johnson et al. |
| 2,767,380 | A | | 10/1956 | Zobel |
| 3,063,027 | A | | 11/1962 | Hughes |
| 4,951,012 | A | | 8/1990 | Oppelt et al. |
| 5,230,085 | A | * | 7/1993 | Loposer ..................... 455/41.2 |
| 5,430,417 | A | * | 7/1995 | Martin et al. ................. 333/33 |
| 5,729,184 | A | * | 3/1998 | Paxman et al. ............. 333/125 |
| 6,844,803 | B1 | * | 1/2005 | Echols, Jr. .................. 336/170 |

FOREIGN PATENT DOCUMENTS

| | | | |
|---|---|---|---|
| DE | 38 11 985 | A1 | 10/1989 |
| DE | 40 35 209 | C2 | 5/1992 |
| DE | 691 31 660 | T2 | 4/2000 |
| DE | 102 17 387 | A1 | 10/2003 |
| EP | 0 469 779 | A3 | 2/1992 |
| EP | 0 910 135 | A2 | 4/1999 |
| GB | 1095103 | | 12/1967 |

* cited by examiner

*Primary Examiner*—Robert Pascal
*Assistant Examiner*—Kimberly Glenn
(74) *Attorney, Agent, or Firm*—Nixon & Vanderhye P.C.

(57) ABSTRACT

An impedance converter device comprises an electrically conductive external conductor with one or more connection locations for electrical lines, an electrically conductive internal conductor with one or more connection locations for electrical lines, and also a dielectric arranged between external conductor and internal conductor. The external conductor comprises a base area bounded by one or more side walls thereby forming an external conductor housing with an internal space and an opening opposite the base area. The internal conductor is arranged in the internal space. The internal conductor and the external conductor are insulated from one another by the dielectric. The internal conductor comprises at least one cutoff bar-type section with a cutoff bar bottom and at least one wall which extends from the bottom in the direction of the opening of the external conductor housing.

26 Claims, 5 Drawing Sheets

IMPEDANCE CONVERTER DEVICE

FIELD

The technology herein relates to an impedance converter device.

BACKGROUND AND SUMMARY

Impedance converters are used nowadays in particular in antenna arrangements for transformation of impedances. The impedance converters serve for matching the impedances resulting from individual radiator elements or antenna components, such as e.g. phase shifters, filters, bandpass filters, in broadband fashion to a common system impedance, which is 50 ohms in the field of mobile radio.

The prior art discloses impedance converters in which an impedance conversion is carried out by means of a $\lambda/4$ transformation by virtue of coaxial cables having a length corresponding to a quarter of the wavelength of the radio frequency with which the antenna arrangement is operated being interposed between connections in the antenna arrangement. In this case, it proves to be disadvantageous that, for the interposition of coaxial cables, a multiplicity of soldering points have to be provided at the ends of the coaxial cables, so that the production of such impedance converters is expensive and also greatly affected by tolerances owing to the diversity of parts. Equally, the prior art discloses tuning screws for altering the impedance in coaxial elements. This type of impedance conversion is also comparatively expensive. Moreover, impedance transformations are carried out by means of impedance converters in the form of strip conductors on circuit boards. What is disadvantageous in this case is that these impedance converters are permissible only for limited radio-frequency powers and a subsequent tuning of the impedance is not possible; in addition, intermodulation problems have to be reckoned with.

Therefore, it is an object of the exemplary illustrative non-limiting technology herein to provide an impedance converter device which can be produced cost-effectively, is suitable for high radio-frequency power and enables a tuning of the impedance in a simple manner.

The impedance converter device according to an exemplary illustrative non-limiting implementation herein is distinguished by a special shaping of an external conductor, of an internal conductor and also of a dielectric located in between. The external conductor of the device comprises a base area bounded by one or more side walls, thereby forming an external conductor housing with an internal space and an opening opposite the base area. The internal conductor is arranged in the internal space, the internal conductor and the external conductor being insulated from one another by the dielectric. The internal conductor comprises at least one cutoff bar-type section with a bottom and at least one wall which extends from the bottom in the direction of the opening of the external conductor housing. The configuration of the external conductor as an open housing enables access to the internal conductor, in particular to the walls of the cutoff bar-type sections. The angle of said walls can be adjusted by a corresponding tool, thereby enabling an operator to tune the impedance in a simple manner without intermodulation problems occurring or the intermodulation properties being impaired. It should be noted in this case that the opening can be closed by a suitable closure device. On the side opposite the base area of the exemplary illustrative non-limiting implementation, the housing is not formed in one piece with all the side walls of the housing, so that an (if appropriate also closed) opening can always be localized in the impedance converter. A further advantage of the exemplary illustrative non-limiting impedance converter is that the external conductor housing can be used universally and only the readily accessible internal conductor has to be exchanged in order to alter the transformation properties of the impedance converter. On account of the structural height attained by the external conductor housing, undesirable emissions of the converter do not occur. Moreover, the converter can be used for very high radio-frequency powers.

Preferably, the impedance converter essentially extends in a longitudinal direction between at least two opposite connection locations. Furthermore, at least web bottom of a cutoff bar-type internal conductor section is assigned at least two walls which extend in the direction of the opening of the external conductor housing in particular from edges of the bottom. In particular, the walls assigned to a bottom are parallel to one another. In one exemplary illustrative non-limiting implementation, the walls assigned to a bottom converge or diverge in the longitudinal direction of the impedance converter in a sectional view along a plane parallel to the base area of the external conductor. As an alternative, the walls assigned to a bottom are parallel to one another. Furthermore, the walls assigned to a bottom may be essentially perpendicular to the bottom. As an alternative, the walls assigned to a bottom diverge or converge in the direction of the opening of the external conductor housing in a sectional view along a plane perpendicular to the longitudinal direction of the impedance converter.

In an exemplary illustrative non-limiting implementation, the external conductor comprises a stamped, one-piece metal sheet with bent-over side walls. This enables the external conductor to be produced extremely inexpensively since the production by stamping is simple and cost-effective. Analogously, the internal conductor is preferably likewise a stamped, one-piece metal sheet with bent-over walls. This results, on the one hand, in cost-effective production of the internal conductor and, on the other hand, ensures good bendability of the walls, so that the impedance can easily be tuned or altered by bending the walls.

In an exemplary illustrative non-limiting implementation, the dielectric is a component with a receptacle, the component being inserted in the internal space of the external conductor housing and the internal conductor being arranged in the receptacle of the component. This results, in a simple manner, in an electrical insulation between internal conductor and external conductor by means of a separate component. In this case, the component is preferably formed in one piece. Furthermore, in a preferred variant, the component is held by force locking, in particular by a clamping, and/or by positive locking and/or by material locking in the external conductor housing. Analogously, the internal conductor may be held by force locking, in particular by a clamping, and/or by positive locking and/or by material locking in the receptacle of the dielectric. This enables simple assembly of the components of the impedance converter according to the exemplary implementation without the need to provide additional fixing means.

In a further preferred variant of the converter, the internal conductor has, at its ends, end sections with at least one or more end areas which extend in the direction of the opening of the external conductor housing. These end sections can be used to fix the position of the internal conductor in the external conductor housing. When this variant is combined with the exemplary implementation in which the dielectric is a component with a receptacle, one or more corners of the receptacle are preferably rounded and receive edges of the end sections of the internal conductor.

In an exemplary illustrative non-limiting implementation, the internal conductor has at least one first cutoff bar-type section for impedance transformation. In this case, the first cutoff bar-type section preferably has a length which is ¼ of the wavelength of a radio frequency which is used for mobile radio transmission, in particular a radio frequency in a GSM network and/or UMTS network. In this case, the length is preferably coordinated with the center frequency to be transmitted. This enables the impedance converter according to the exemplary implementation to be used as a $\lambda/4$ transformer in customary mobile radio networks. The impedance converter also makes it possible, if appropriate, to carry out multistage $\lambda/4$ transformations when using long external conductors.

In a further illustrative exemplary non-limiting implementation, the internal conductor has at least one second cutoff bar-type section for length adaptation of the internal conductor. The second cutoff bar-type section has the effect that the length of the internal conductor is always identical, independently of the radio-frequencies used, so that the internal conductor can always be inserted into an identically constructed external conductor housing. Consequently, the impedance converter can be adapted to different antenna systems in a simple manner by exchanging the internal conductor.

In order to connect the impedance converter to electrical lines, connection locations are provided in external conductor and in the internal conductor, said connection locations preferably comprising openings at ends of the external conductor and of the internal conductor, respectively. Each opening of the external conductor is preferably aligned with an opening of the internal conductor, the aligned openings in each case being connected to one another through an opening in the dielectric. The openings of the external conductor and of the internal conductor are preferably designed for receiving and subsequently soldering coaxial cables, the openings of the external conductor serving to receive a coaxial external conductor and the openings of the internal conductor serving to receive a coaxial internal conductor. The openings of the dielectric are preferably in each case accommodated in cutouts which serve in particular to receive an insulation arranged between a coaxial external conductor and a coaxial internal conductor. Furthermore, the openings of the external conductor may comprise at least one shoulder which serves in particular as a stop for an end of a coaxial external conductor.

In an exemplary illustrative impedance converter implementation, coaxial cables are soldered by means of soldering paste and/or integrated soldering moldings at the openings of the external conductor and of the internal conductor. This enables the coaxial cables to be soldered to the impedance converter in an automated and cost-effective manner.

In a refinement, the exemplary illustrative dielectric used in the impedance converter may comprise air, which means that the internal and external conductors of the impedance converter are spaced apart from one another by additional spacing means.

In a further refinement of the exemplary impedance converterimplementation, the internal conductor is configured in compartment-like fashion with a plurality of cutoff bar-type sections arranged parallel. This enables the device to be interconnected with a plurality of different systems. In order to fix the cutoff bar-type sections, the latter are in each case arranged in a cutout in the dielectric.

BRIEF DESCRIPTION OF THE DRAWINGS

These and other features and advantages will be better and more completely understood by referring to the following detailed description of exemplary non-limiting illustrative implementations in conjunction with the drawings of which.

DETAILED DESCRIPTION

Figure 2:
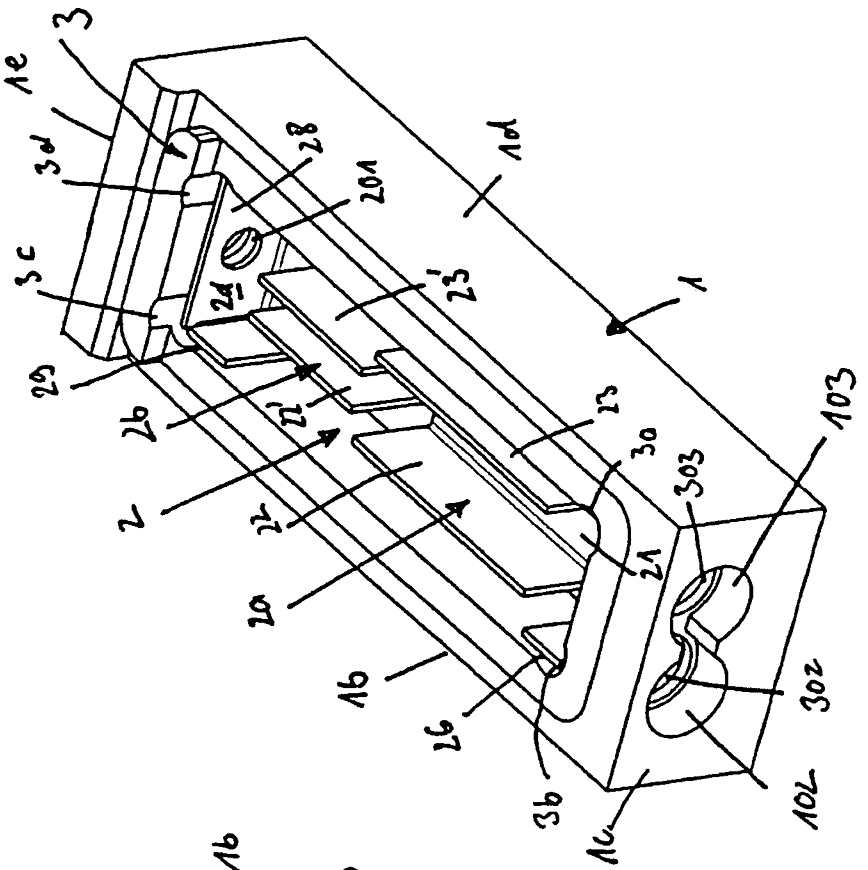
FIG. 2 shows a perspective view of the exemplary impedance converter of FIG. 1 rotated through 180° with respect to FIG. 1.
Figure 1:
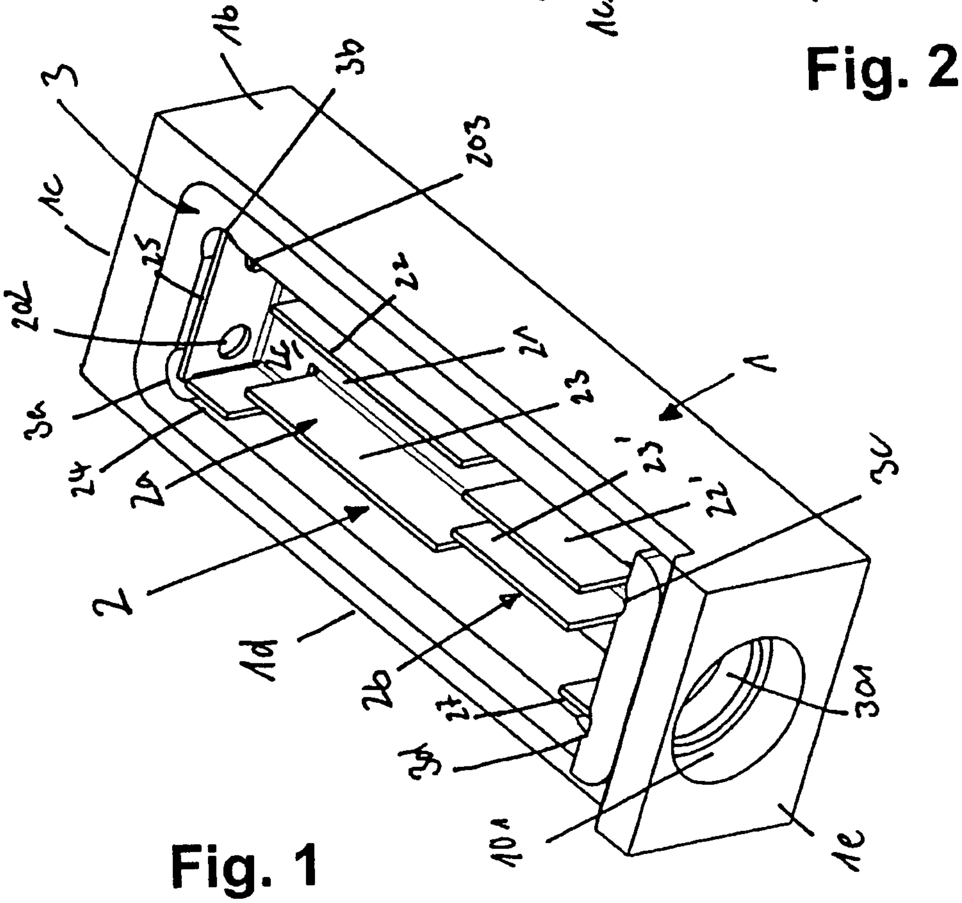
FIG. 1 shows a perspective view of an exemplary illustrative non-limiting impedance converter.
Figure 1A:
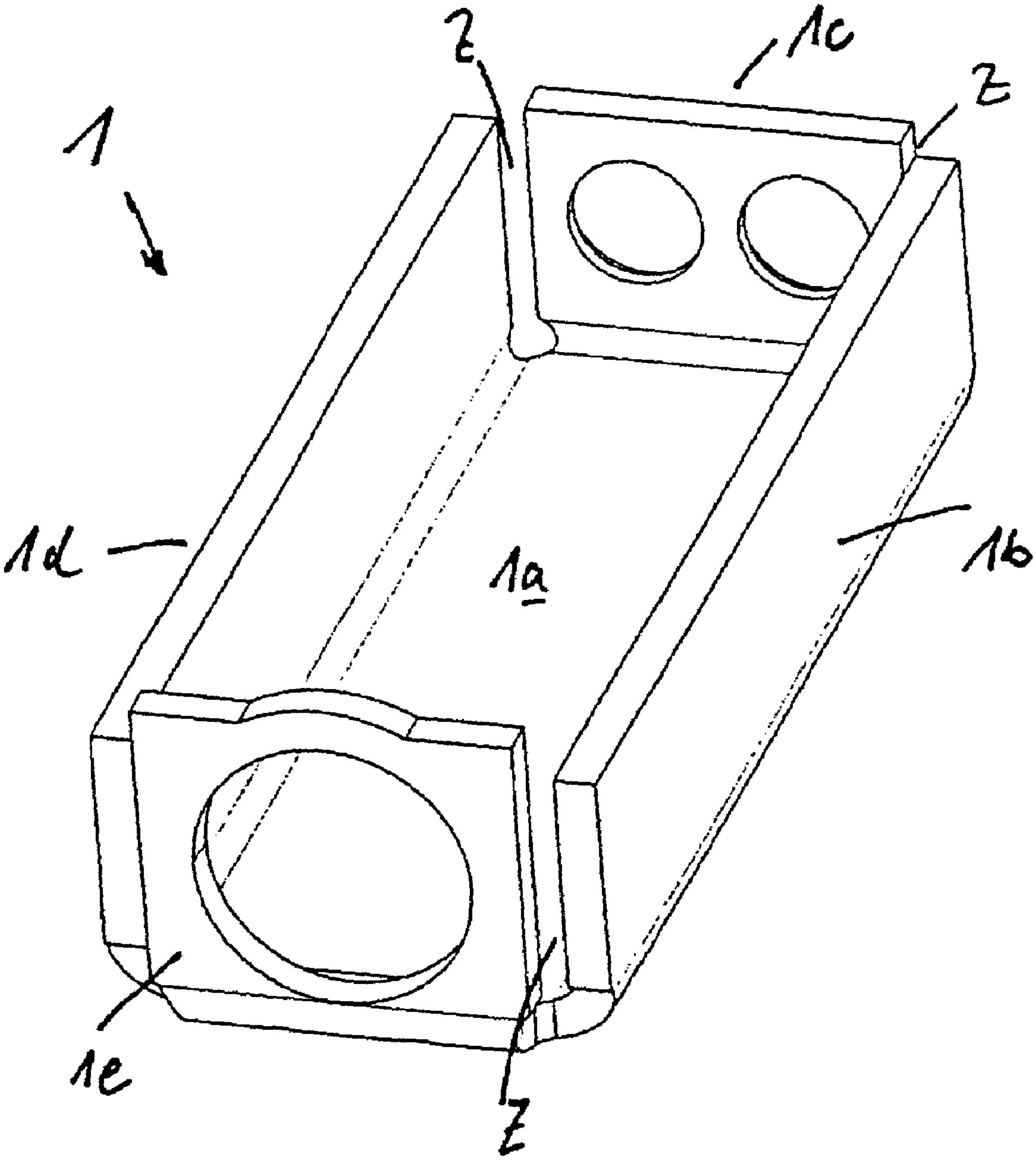
FIG. 1*a* shows a perspective view of an exemplary illustrative non-limiting external conductor used in the impedance converter.

FIG. 1 and FIG. 2 show perspective views of an exemplary illustrative non-limiting implementation of an impedance converter. The exemplary converter comprises an external conductor in the form of an external elongate metal housing 1, the housing being open at the top side and comprising a stamped metal sheet. The housing is of essentially rectangular configuration and has a base area 1*a* (not visible in FIG. 1 and FIG. 2) and also side walls 1*b*, 1*c*, 1*d* and 1*e*. As is shown in FIG. 1*a*, the external conductor 1 is preferably a metal sheet part whose side walls are upwardly bent sections of the metal sheet part. In this case, the edges of the individual side walls are spaced apart from one another by narrow interspaces Z. In the interior of the external conductor shown in FIG. 1*a*, the dielectric 3 may be fixedly clamped by force locking by means of the bent side walls.

The dielectric is likewise open at the top side and an internal conductor 2 is inserted in its interior. Said internal conductor has end sections 2*c* and 2*d* respectively comprising side walls 24, 25, 26 and 27, 28, 29. The end sections are pushed into the dielectric 3 by means of rounded corners 3*a*, 3*b*, 3*c* and 3*d*. The internal conductor 2 has a length such that it is fixedly clamped in the internal space of the dielectric 3 by means of the end sections 2*c* and 2*d*. The internal conductor comprises two cutoff bar ("web")-type sections 2*a* and 2*b* connected to one another between the end sections 2*c* and 2*d*. The first cutoff bar-type section 2*a* comprises a bottom 21 and two walls 22 and 23 extending perpendicularly upward. Analogously, the second cutoff bar-type section 2*b* comprises a bottom 21' (not visible in FIGS. 1 and 2) and walls 22' and 23'. The internal conductor is preferably formed as a one-piece metal sheet, in which case, in the metal sheet, first of all the shaping of the side walls of the end section and of the cutoff bar-type sections is stamped out and then the side walls and walls are bent upward. The use of stamped sheets for the external conductor and the internal conductor ensures inexpensive and simple production of the impedance converter.

The transformation impedance can be set by means of the width of the cutoff bar-type sections 2*a*, 2*b* and the corresponding bent-up walls or by means of the height of the cutoff bar-type sections above the external conductor bottom (spacing through dielectric).

The first cutoff bar-type section 2*a* serves for impedance transformation if the impedance converter is soldered in an antenna arrangement between coaxial cables. The length of the first cutoff bar-type section 2*a* is ¼ of a wave length λ, as a result of which a λ/4 transformation is carried out, where λ corresponds to the wavelength of the radio frequency with which the corresponding antenna arrangement is operated. The customary mobile radio frequencies, such as e.g. 900 or 1800 MHz in GSM networks, are preferably involved in this case. In contrast to the first cutoff bar-type section 2*a*, the second cutoff bar-type section 2*b* of the impedance converter primarily serves for length correction. In other words, the length of the second cutoff bar-type section is always chosen in a manner dependent on the length of the first cutoff bar-type section and the total length of the impedance converter such that the internal conductor is always fixed in the same position in the dielectric.

The internal conductor 2 has the major advantage that its impedance can be adapted or altered by bending the walls of the first cutoff bar-type section 2*a*. This is advantageous in particular during the manufacture of the impedance converter, since, at the end of the manufacturing process, possible tolerances in the impedance can again be compensated for by bending the walls 22 and 23, respectively. If appropriate, the second cutoff bar-type section may also be configured in such a way that it likewise influences the impedance, so that the impedance of the converter can also be altered by bending the walls 22' and 23', respectively.

The external conductor 1 of the impedance converter has a cylindrical opening 101 in the side area 1*e* and also two cylindrical openings 102 and 103 connected to one another in the side area 1*c*. These openings are connected to smaller cylindrical openings 201, 202 and 203 in the end sections 2*c* and 2*d*, respectively, via corresponding cylindrical openings 301, 302 and 303 in the dielectric 3. The openings in the external conductor and in the internal conductor serve for connection to a coaxial cable, the openings of the external conductor serving to receive a coaxial external conductor and the corresponding openings in the internal conductor serving to receive the corresponding coaxial internal conductor. In order to fix the coaxial conductors of the cable, the conductors are soldered to the openings. In particular, solderings for the coaxial external conductors are provided at the outer sides of the side walls 1*c* and 1*e* of the housing 1 and solderings for the coaxial internal conductor are provided in the end sections 2*c* and 2*d* of the internal conductor 2. By means of integrated soldering moldings or soldering pastes, the internal and external conductor soldering between the impedance converter and the coaxial cables can be effected in an automated manner (e.g. induction soldering). In comparison with conventional impedance converters in which coaxial cables for impedance conversion are soldered in as an intermediate connection, a smaller number of soldering locations are required in the exemplary illustrative non-limiting impedance converter. Furthermore, the structural height of the impedance converter prevents emissions which occur, for example in the case of impedance converters in the form of strip conductors on circuit boards.

Figure 3:
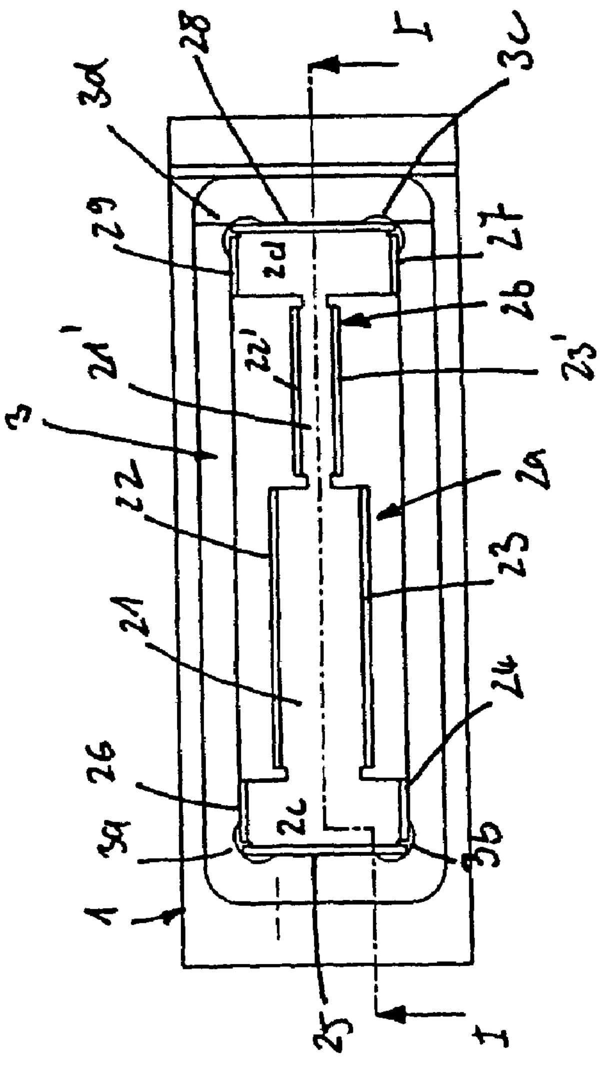
FIG. 3 shows a plan view of the exemplary impedance converter of FIG. 1.

FIG. 3 shows a plan view of the impedance converter from FIG. 1 and FIG. 2. FIG. 3 reveals in particular that the bottom 21 of the first cutoff bar-type section 2*a* is wider than the bottom 21' of the second cutoff bar-type section 2*b*. Furthermore, the length of the second cutoff bar-type section is less than the length of the first cutoff bar-type section. What is achieved by virtue of the size-reduced design of the second cutoff bar-type section is that this section has only a small influence or no influence at all on the impedance of the converter. FIG. 3 furthermore reveals that the walls 22 and 23 and also 22' and 23' of the cutoff bar-type sections are readily accessible from above, so that an operator can readjust or tune the impedance, if appropriate, by bending the walls.

Figure 4:
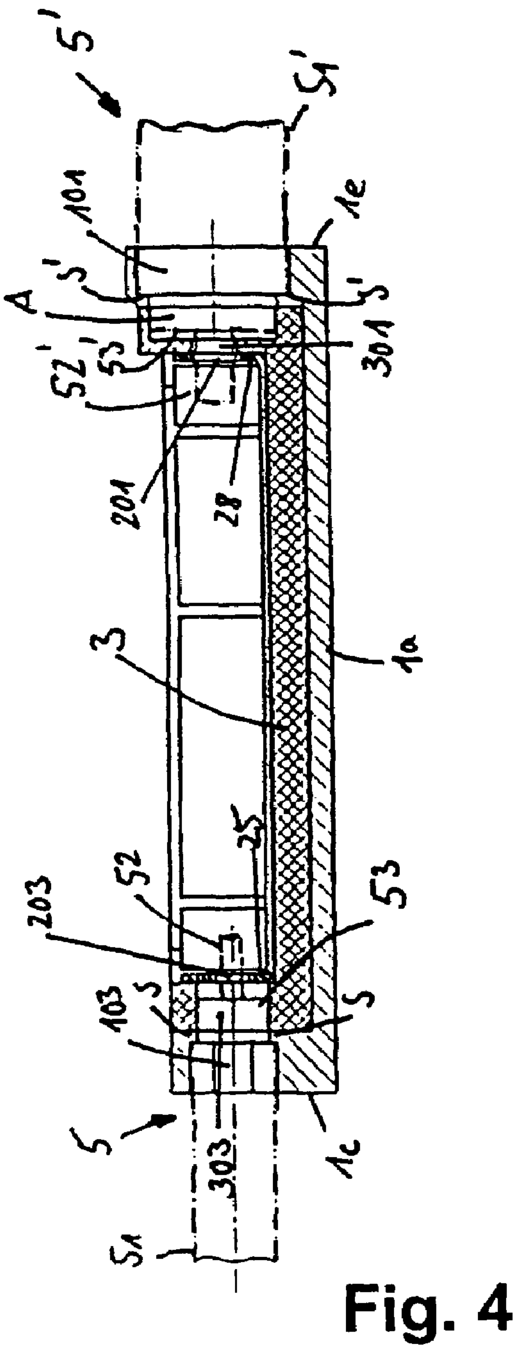
FIG. 4 shows a sectional view of the exemplary impedance converter of FIG. 3 along the line I—I.

FIG. 4 shows a sectional view along the line I—I of FIG. 3, broken lines indicating the position of coaxial cables which are connected to the impedance converter. Furthermore, the cross section of the external conductor housing 1 is indicated by a single hatching, whereas the cross section of the dielectric 3 is represented by a double hatching. FIG. 4 reveals, in particular, the diameters of the openings 101 and 103 in the external conductor housing, of the openings 301 and 303 in the dielectric and also of the openings 201 and 203 in the internal conductor housing. Of the openings 103, 203 and 303, the opening 103 has the largest diameter, and serves to receive a coaxial external conductor 51 of a coaxial cable 5. In this case, the inserted coaxial external conductor stops at a peripheral shoulder S in the opening 103. The opening 303 has a smaller diameter than the opening 103 and serves to receive an insulation 53 of the coaxial cable 5. The opening 203 has the smallest diameter and serves to receive the coaxial internal conductor 52 of the coaxial cable 5. The coaxial external conductor 51 is fixed by means of a soldering to the outer side of the side wall 1*c*. Analogously, the coaxial internal conductor 52 is soldered to the inner side of the side wall 25.

The openings 101, 201 and 301 in the region of the side wall 1*e* are designed for a larger or lower-attenuation coaxial cable 5'. Analogously to the opening 103, the opening 101 has a corresponding shoulder S' against which one end of a coaxial external conductor 51' stops. The opening 301 is smaller than the opening 101 and it is arranged in a cylindrical cutout A in the dielectric 3, the cutout being chosen in such a way that the insulation 53' of the coaxial cable 5' can be accommodated therein. The size of the opening 201 in the internal conductor 2 essentially corresponds to the size of the opening 301 in the dielectric 3, the diameter of the openings being chosen in such a way that the coaxial internal conductor 52' of the coaxial cable 5' fits through the openings. Analogously to the opposite side of the impedance converter, the coaxial internal conductor 52' is soldered to the inner side of the side wall 28 and the coaxial external conductor 51' is soldered to the outer side of the side wall 1*e*. If, by way of example, two coaxial cables each having an impedance of 50 ohms are inserted via the openings 102 and 103, an input impedance of 25 ohms is produced at this location. The impedance of the impedance converter is to be set to 35 ohms in such a case, in order that an impedance of 50 ohms is produced again at the opposite opening 101. Instead of two connection locations for coaxial cables at the side wall 1*e*, it would also be possible, if appropriate, to provide only a single connection location for an individual coaxial cable.

Figure 6:
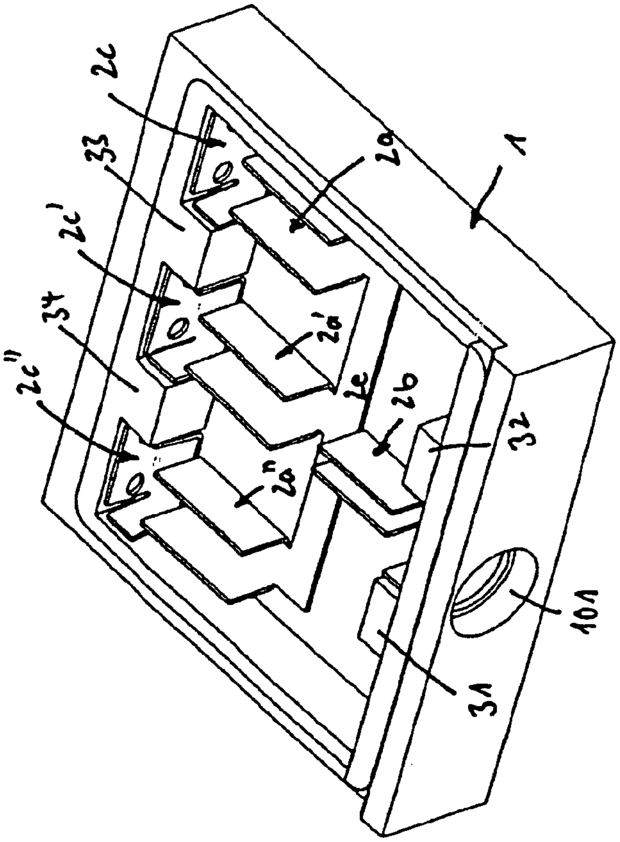
FIG. 6 shows a perspective view of the exemplary impedance converter of FIG. 5 rotated through 180° with respect to FIG. 5.
Figure 5:
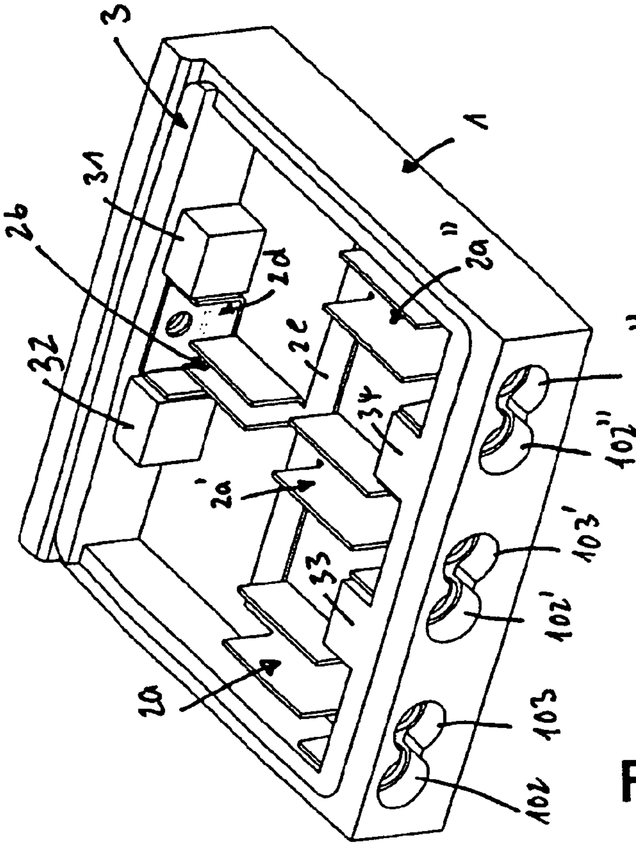
FIG. 5 shows a perspective view of a further exemplary illustrative non-limiting impedance converter.

FIGS. 5 and 6 show two perspective views of a second exemplary illustrative non-limiting implementation of an impedance converter, the view of FIG. 6 being rotated through 180° with respect to the view of FIG. 5. In contrast to the first exemplary implementation, the internal conductor 2 of the impedance converter is configured in compartment-type fashion, three cutoff-bar-type sections 2a, 2a' and 2a" arranged parallel to one another being provided instead of an individual first cutoff bar-type section. However, it is also possible to provide only two or else more of such cutoff bar-type sections arranged parallel. The cutoff bar-type sections are connected to the second cutoff bar-type section 2b via a transversely running web 2e. In order to contact-connect the three first cutoff bar-type sections to corresponding coaxial cables, respectively interconnected openings 102, 103 and 102', 103' and 102", 103" are provided in the external conductor 1. Furthermore, each cutoff bar-type section 2a, 2a' and 2a" opens into separate end sections 2c, 2c' and 2c", respectively, as emerges in particular from FIG. 6. An end section 2d likewise adjoins one side of the cutoff bar-type section 2b. Analogously to the preceding illustrative implementation, all the openings in the external conductor 1 are aligned with corresponding openings in the dielectric and in the internal conductor. In order to fix the internal conductor in the dielectric, corresponding receptacles for the end sections 2c, 2c', 2c" and 2d are provided in the internal space of the dielectric. Said receptacles are formed by parallelepipedal projections 31, 32, 33 and 34 at the inner sides of the dielectric. The internal conductor is thereby fixed on the dielectric.

Figure 7:
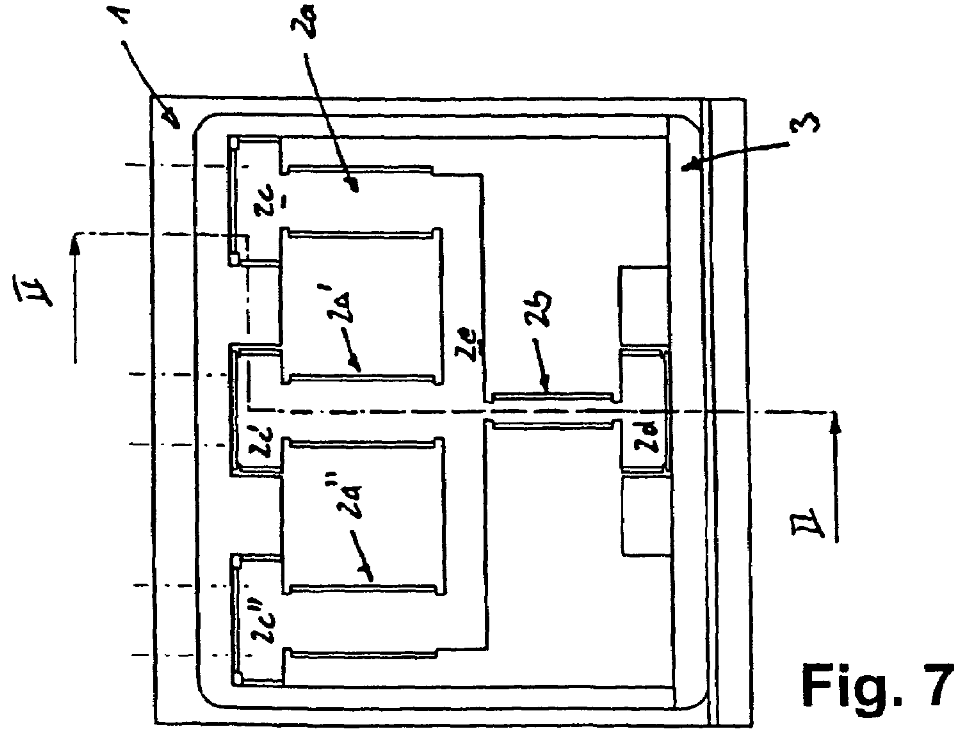
FIG. 7 shows a plan view of the exemplary impedance converter of FIG. 6.

FIG. 7 shows a plan view of the impedance converter of FIG. 5 and FIG. 6. FIG. 7 reveals, in particular, the structure of the internal conductor. It can be seen that the three parallel cutoff bar-type sections 2a, 2a', 2a" are configured identically and have a larger width than the cutoff bar-type section 2b. However, the cutoff bar-type sections may also have different widths in order to achieve a desired power division. By bending the walls of the cutoff bar-type sections 2a, 2a' and 2a", it is again possible to tune or alter the impedance since the cutoff bar-type sections 2a, 2a' and 2a" essentially perform the function of impedance transformation. The narrower cutoff bar-type section 2b serves for length adaptation or, if appropriate, also for impedance transformation of the three individual branches of the internal conductor 2, the length of the section always being chosen such that the internal conductor is fixedly clamped in the internal space of the dielectric 3 between opposite side walls of the dielectric. On account of its fanned-out form, the impedance converter serves for connecting a plurality of parallel coaxial cables, thereby enabling an interconnection and impedance transformation of a plurality of antenna systems.

Figure 8:
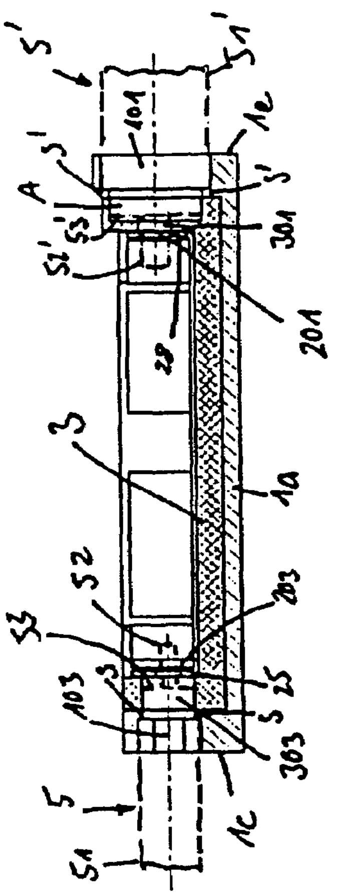
FIG. 8 shows a sectional view of the exemplary impedance converter of FIG. 7 along the line II—II.

FIG. 8 shows a sectional view along the line II—II of FIG. 7. This reveals, in particular, the dimensions of the cylindrical openings in the impedance converter, corresponding coaxial cables 5 and 5' being inserted in the openings for illustration purposes. The construction of the converter in accordance with FIG. 8 is essentially identical to the construction of the converter of FIG. 4, identical structural parts being designated by the same reference symbols. Therefore, a detailed description of the construction of FIG. 8 is dispensed with and reference is made in this respect to FIG. 4. The arrangement of the openings 103, 203 and 303 in the region of the end section 2c is illustrated on the left-hand side of the impedance converter of FIG. 8, the arrangement of the openings in the corresponding end sections 2c' and 2c" being identical. Analogously to FIG. 4, the opening 103 has a shoulder S for receiving the coaxial external conductor 51. Likewise, a shoulder S' is provided on the opposite, right-hand side of the converter in the opening 101 and the opening 301 is arranged in a cutout A which serves to receive the insulation 53'. As is described with reference to FIG. 4, the external and internal conductors of the coaxial cables are soldered to the external and internal conductors of the impedance converter.

While the technology herein has been described in connection with exemplary illustrative non-limiting implementations, the invention is not to be limited by the disclosure. The invention is intended to be defined by the claims and to cover all corresponding and equivalent arrangements whether or not specifically disclosed herein.

The invention claimed is:

1. An impedance converter device for converting impedances in antenna arrangements, comprising:

an electrically conductive external conductor with at least one connection location, an electrically conductive internal conductor with at least another connection location, a dielectric disposed between the external conductor and internal conductor, the external conductor comprising a base area bounded by at least one side wall thereby forming an external conductor housing defining therein an internal space and an opening opposite the base area;

the internal conductor being disposed in the internal space defined within the external conductor, the internal conductor and the external conductor being insulated from one another by the dielectric;

the internal conductor comprising at least one section having outwardly extending bars with a bottom and at least one wall which extends outwardly from the bottom in the direction of the opening of the external conductor housing, wherein the at least one connection location and the at least another connection location are disposed opposite to one another, the impedance converter extends in a longitudinal direction between the opposite connection locations, and the bottom of said section with outwardly extending bars is assigned at least two walls which extend outwardly in the direction of the opening of the external conductor housing from edges of the bottom.

2. The device according to claim 1, further including a closure device that closes the opening defined within the external conductor housing.

3. The device according to claim 1, wherein said at least one wall converges or diverges in the longitudinal direction of the impedance converter in a sectional view along a plane parallel to the base area of the external conductor.

4. The device according to claim 1, wherein said at least one wall comprises plural parallel walls.

5. The device according to claim 1, wherein said at least one wall diverges or converges in the direction of the opening defined within the external conductor housing in a sectional view along a plane perpendicular to the longitudinal direction of the impedance converter.

6. The device according to claim 1, wherein the external conductor comprises a stamped, one-piece metal sheet with bent-over side walls.

7. The device according to claim 1, wherein the internal conductor comprises a stamped, one-piece metal sheet having bent-over sides.

8. The device according to claim 1, wherein the internal conductor has at least one first section with outwardly extending bars for impedance transformation.

9. The device according to claim 1, wherein the connection locations of the external conductor and of the internal conductor comprise openings at ends of the external conductor and of the internal conductor.

10. The device according to claim 9, wherein the opening defined within the external conductor opposite the base area is aligned with the opening of the internal conductor, the aligned openings in each case being connected to one another through an opening in the dielectric.

11. The device according to claim 10 wherein the openings of the dielectric are defined within cutouts which serve to receive an insulation arranged between a coaxial external conductor and a coaxial internal conductor.

12. The device according to claim 9, wherein the opening of the external conductor and of the internal conductor are designed for receiving and subsequently soldering coaxial cables, the opening of the external conductor serving to receive a coaxial external conductor and the openings of the internal conductor serving to receive a coaxial internal conductor.

13. The device according to claim 9, wherein coaxial cables are soldered by means of soldering paste and/or integrated soldering moldings at the openings of the external conductor and of the internal conductor.

14. The device according to claim 1, wherein the dielectric is air.

15. An impedance converter device for converting impedances in antenna arrangements, comprising:

an electrically conductive external conductor with at least one connection location, an electrically conductive internal conductor with at least another connection location, a dielectric disposed between the external conductor and internal conductor, the external conductor comprising a base area bounded by at least one side wall thereby forming an external conductor housing defining therein an internal space and an opening opposite the base area;

the internal conductor being disposed in the internal space defined within the external conductor, the internal conductor and the external conductor being insulated from one another by the dielectric;

the internal conductor comprising at least one section having outwardly extending bars with a bottom and at least one wall which extends outwardly from the bottom in the direction of the opening of the external conductor housing, further including a closure device that closes the opening defined within the external conductor housing, wherein said at least one wall is substantially perpendicular to the bottom.

16. An impedance converter device for converting impedances in antenna arrangements, comprising:

an electrically conductive external conductor with at least one connection location, an electrically conductive internal conductor with at least another connection location, a dielectric disposed between the external conductor and internal conductor, the external conductor comprising a base area bounded by at least one side wall thereby forming an external conductor housing defining therein an internal space and an opening opposite the base area;

the internal conductor being disposed in the internal space defined within the external conductor, the internal conductor and the external conductor being insulated from one another by the dielectric;

the internal conductor comprising at least one section having outwardly extending bars with a bottom and at least one wall which extends outwardly from the bottom in the direction of the opening of the external conductor housing, and further including a receptacle, wherein the dielectric is a component with the receptacle, the component being inserted in the internal space of the external conductor housing and the internal conductor being arranged in the receptacle of the component.

17. The device according to claim 16, wherein the component is formed in one piece.

18. The device according to claim 16, wherein the component is held by locking in the external conductor housing.

19. The device according to claim 16, wherein the internal conductor is held by locking in the receptacle of the dielectric.

20. An impedance converter device for converting impedances in antenna arrangements, comprising:

an electrically conductive external conductor with at least one connection location, an electrically conductive internal conductor with at least another connection location, a dielectric disposed between the external conductor and internal conductor, the external conductor comprising a base area bounded by at least one side wall thereby forming an external conductor housing defining therein an internal space and an opening opposite the base area;

the internal conductor being disposed in the internal space defined within the external conductor, the internal conductor and the external conductor being insulated from one another by the dielectric;

the internal conductor comprising at least one section having outwardly extending bars with a bottom and at least one wall which extends outwardly from the bottom in the direction of the opening of the external conductor housing, wherein the internal conductor has, at ends thereof end sections with at least one or more end areas which extend in the direction of the opening of the external conductor housing.

21. The device according to claim 20, wherein at least one corner of the receptacle of the dielectric is rounded and receives edges of the end sections of the internal conductor.

22. An impedance converter device for converting impedances in antenna arrangements, comprising:

an electrically conductive external conductor with at least one connection location, an electrically conductive internal conductor with at least another connection location, a dielectric disposed between the external conductor and internal conductor, the external conductor comprising a base area bounded by at least one side wall thereby forming an external conductor housing defining therein an internal space and an opening opposite the base area;

the internal conductor being in the internal space defined within the external conductor, the internal conductor and the external conductor being insulated from one another by the dielectric;

the internal conductor comprising at least one section having outwardly extending bars with a bottom and at least one wall which extends outwardly from the bottom in the direction of the opening of the external conductor housing, wherein the internal conductor has at least one first section with outwardly extending bars for impedance transformation, wherein the internal conductor has at least one second section with outwardly extending bars for length adaptation of the internal conductor.

23. An impedance converter device for converting impedances in antenna arrangements, comprising:

an electrically conductive external conductor with at least one connection location, an electrically conductive internal conductor with at least another connection location, a dielectric disposed between the external conductor and internal conductor, the external conductor comprising a base area bounded by at least one side wall thereby forming an external conductor housing defining therein an internal space and an opening opposite the base area;

the internal conductor being disposed in the internal space defined within the external conductor, the internal conductor and the external conductor being insulated from one another by the dielectric;

the internal conductor comprising at least one section having outwardly extending bars with a bottom and at least one wall which extends outwardly from the bottom in the direction of the opening of the external conductor housing, wherein the internal conductor has at least one first section with outwardly extending bars for impedance transformation, wherein the first section with outwardly extending bars has a length which is ¼ of the wavelength of a radio frequency which is used for mobile radio transmission at a radio frequency in a GSM network and/or UMTS network.

24. An impedance converter device for converting impedances in antenna arrangements, comprising:

an electrically conductive external conductor with at least one connection location, an electrically conductive internal conductor with at least another connection location, a dielectric disposed between the external conductor and internal conductor, the external conductor comprising a base area bounded by at least one side wall thereby forming an external conductor housing defining therein an internal space and an opening opposite the base area;

the internal conductor being disposed in the internal space defined within the external conductor, the internal conductor and the external conductor being insulated from one another by the dielectric;

the internal conductor comprising at least one section having outwardly extending bars with a bottom and at least one wall which extends outwardly from the bottom in the direction of the opening of the external conductor housing, wherein the connection locations of the external conductor and of the internal conductor comprise openings at ends of the external conductor and of the internal conductor, wherein the opening of the external conductor comprise at least one shoulder which serves as a stop for an end of a coaxial external conductor.

25. An impedance converter device for converting impedances in antenna arrangements, comprising:

an electrically conductive external conductor with at least one connection location, an electrically conductive internal conductor with at least another connection location, a dielectric disposed between the external conductor and internal conductor, the external conductor comprising a base area bounded by at least one side wall thereby forming an external conductor housing defining therein an internal space and an opening opposite the base area;

the internal conductor being disposed in the internal space defined within the external conductor, the internal conductor and the external conductor being insulated from one another by the dielectric;

the internal conductor comprising at least one section having outwardly extending bars with a bottom and at least one wall which extends outwardly from the bottom in the direction of the opening of the external conductor housing, wherein the internal conductor is configured to have compartments with a plurality of sections with outwardly extending bars arranged in parallel.

26. The device according to claim 25, wherein one end of the web-type sections is in each case arranged in a cutout in the dielectric.

* * * * *